（12） United States Patent
Fukuda et al.

(10) Patent No.: US 8,333,838 B2
(45) Date of Patent: *Dec. 18, 2012

(54) METHOD FOR PRODUCING FLUORIDE CRYSTAL

(75) Inventors: Tsuguo Fukuda, Sendai (JP); Hirohisa Kikuyama, Izumiootsu (JP); Tomohiko Satonaga, Izumiootsu (JP)

(73) Assignees: Stella Chemifa Corporation, Osaka (JP); Fukuda Crystal Laboratory, Miyagi (JP)

( * ) Notice: Subject to any disclaimer, the term of this patent is extended or adjusted under 35 U.S.C. 154(b) by 211 days.

This patent is subject to a terminal disclaimer.

(21) Appl. No.: 12/805,786

(22) Filed: Aug. 19, 2010

(65) Prior Publication Data

US 2011/0000423 A1  Jan. 6, 2011

Related U.S. Application Data

(62) Division of application No. 10/554,424, filed as application No. PCT/JP2004/005917 on Apr. 23, 2004.

(30) Foreign Application Priority Data

Apr. 23, 2003 (JP) .................................. 2003-119000

(51) Int. Cl.
C30B 15/08 (2006.01)
(52) U.S. Cl. ................. 117/13; 117/18; 117/19; 117/20
(58) Field of Classification Search ............. 117/13, 117/18, 19, 20
See application file for complete search history.

(56) References Cited

U.S. PATENT DOCUMENTS

| 3,273,969 | A | 9/1966 | Sirgo |
| 3,278,282 | A | 10/1966 | Ferdinand |
| 3,471,266 | A | 10/1969 | Belle |
| 3,527,574 | A | 9/1970 | Belle |
| 3,544,293 | A | 12/1970 | Riebling |
| 3,726,656 | A | 4/1973 | Reid et al. |
| 3,915,656 | A | 10/1975 | Mlavsky et al. |
| 3,918,946 | A | 11/1975 | Jaray |
| 3,985,177 | A | 10/1976 | Buehler |
| 4,267,010 | A | 5/1981 | Bates et al. |

(Continued)

FOREIGN PATENT DOCUMENTS

DE  199 31 784  1/2000

(Continued)

OTHER PUBLICATIONS

Chant V I et al: "Growth of Tb3Ga5O12 fiber and bulk crystals using micro-pulling-down apparatus", Journal of Crystal Growth March 2000 Elsevier Science B. V., vol. 210, No. 4, Mar. 2000, pp. 663-669.

Primary Examiner — Bob M Kunemund
(74) Attorney, Agent, or Firm — Young & Thompson

(57) ABSTRACT

Provided is an apparatus capable of producing a fluoride crystal in a very short period of time, and a method suitable for producing a fluoride crystal using the apparatus. The apparatus comprises a chamber, a window material, and the like, and is modified such that it can evacuate air from the chamber to provide a high degree vacuum there. The apparatus further includes a crucible, which has a perforation at its bottom. The capillary portion of the perforation is adjusted to facilitate the contact of a seed crystal with a melt. By using the apparatus it is possible to stably produce high quality single crystals of fluorides in a short period of time.

8 Claims, 2 Drawing Sheets

U.S. PATENT DOCUMENTS

| | | |
|---|---|---|
| 4,269,652 A | 5/1981 | Yancy |
| 4,277,270 A | 7/1981 | Krohn |
| 4,289,516 A | 9/1981 | Krohn |
| 4,416,680 A | 11/1983 | Bruning et al. |
| 4,532,000 A | 7/1985 | Harrington et al. |
| 4,897,100 A | 1/1990 | Nice |
| 4,915,773 A | 4/1990 | Kravetsky et al. |
| 5,074,532 A | 12/1991 | Ducrocq |
| 5,114,528 A | 5/1992 | Kou |
| 5,126,200 A | 6/1992 | Nordine |
| 5,370,078 A | 12/1994 | Kou et al. |
| 5,549,971 A | 8/1996 | Nordine |
| 5,690,734 A | 11/1997 | Imaeda et al. |
| 5,879,449 A | 3/1999 | Beswick |
| 5,919,304 A | 7/1999 | Imaeda et al. |
| 5,961,720 A | 10/1999 | Imaeda et al. |
| 6,036,775 A | 3/2000 | Imaeda et al. |
| 6,153,011 A | 11/2000 | Pandelisev |
| 6,402,835 B2 | 6/2002 | Murasato et al. |
| 6,447,603 B2 | 9/2002 | Imai et al. |
| 6,527,851 B2 | 3/2003 | Imai et al. |
| 6,565,654 B2 | 5/2003 | Yokoyama et al. |
| 6,800,137 B2 | 10/2004 | Pandelisev |
| 6,970,630 B2 | 11/2005 | Sigel et al. |
| 7,111,476 B2 | 9/2006 | Loxley et al. |
| 7,323,053 B2 | 1/2008 | Tohta et al. |
| 7,413,606 B2 * | 8/2008 | Satonaga et al. ................ 117/23 |
| 2002/0092465 A1 | 7/2002 | Pandelisev |
| 2005/0109062 A1 | 5/2005 | Stelle et al. |
| 2006/0174658 A1 | 8/2006 | Huang et al. |
| 2007/0056508 A1 | 3/2007 | Fukuda et al. |
| 2009/0065969 A1 | 3/2009 | Perera et al. |
| 2009/0081456 A1 | 3/2009 | Goyal |

FOREIGN PATENT DOCUMENTS

| | | |
|---|---|---|
| DE | 102 08 157 | 9/2002 |
| EP | 1 160 359 | 12/2001 |
| JP | 4-280891 | 10/1992 |
| JP | 8-183693 | 7/1996 |
| JP | 8-259376 | 10/1996 |
| JP | A8319191 | 12/1996 |
| JP | 10-265293 | 10/1998 |
| JP | 11-116393 | 4/1999 |
| JP | 11-130594 | 6/1999 |
| JP | 11-278994 | 10/1999 |

* cited by examiner

METHOD FOR PRODUCING FLUORIDE CRYSTAL

TECHNICAL FIELD

The present invention relates to an apparatus for producing a fluoride crystal and to a method for producing the same.

BACKGROUND ART (Patent Document 1)
Japanese Unexamined Patent Application Publication No. 11-130594
(Patent Document 2)
Japanese Unexamined Patent Application Publication No. 10-265293
(Patent Document 3)
Japanese Unexamined Patent Application Publication No. 8-259375
(Non-Patent Document 1)
Handbook of Applied Physics, 2nd edition, Maruzen, p. 427

With the increased high density integration of semiconductor elements, light sources employed in the various aspects of semiconductor fabrication come to use a beam having an ever shorter wavelength. Demand for a beam with a shorter wavelength currently reaches as far as the realm of vacuum ultraviolet rays. For the optical materials handling a beam with such a short wavelength, fluoride crystals have been used because of their high permeability to light. For example, for the optical materials used in an optical lithography apparatus to emit an ArF excimer laser (193 nm) or an $F_2$ excimer laser (157 nm), single crystals of fluoride such as those of calcium fluoride, barium fluoride and magnesium fluoride have been used. Besides, development of new crystals of fluorides is urgently demanded in connection with the generation of ultraviolet and infrared lasers, UV cut windowpanes, optical materials for medical use, etc.

For the production of fluoride crystals, the Bridgman or CZ method has been principally employed to produce single bulk crystals. This mass of a single bulk crystal is cut into pieces according to given applications and measurement purposes (see, for example, Patent Document 1). Acquisition of single crystals by these methods, however, requires enormous cost and takes several days which significantly retards the efforts for the development of new fluoride materials. This is particularly true for the CZ method. When a fluoride crystal is grown by this method, a seed crystal is brought into contact with the top of fluoride melt. If some impurities float on the top, they must be removed. Such impurities, if any, may lengthen further the time of crystal growth and affect the quality of crystal.

On the other hand, for the production of single crystals of oxides and their eutectic mixtures, and of Si crystals, micro-pulling-down method has been practiced (Patent Documents 2 and 3, and Non-Patent Document 1). For example, Patent Document 2 describes a concrete apparatus based on the method in paragraph [0025] and FIG. 1.

By using the techniques disclosed in Patent Documents 2 and 3, and Non-Patent Document 2, it is possible to grow a single crystal at a pace significantly higher (in the order of 1 to 2) than conventional techniques. These techniques enable the contraction of time necessary for the growth of single crystals, and production of high quality crystals having a significantly large size from a more limited amount of material, as compared with conventional techniques. Furthermore, according to these techniques, crystal is pulled up through a tiny perforation formed at the bottom of a crucible, which eliminates the need for the removal of impurities floating on the surface of melt.

However, in the description of Patent Document 2, the technique is exclusively used for the production of single crystals of strong dielectric compounds such as $LiNbO_3$, $LiTaO_3$, KLN, etc. Also the technique described in Patent Document 3 is exclusively used for the production of single crystals of tungsten bronze structures represented by KLN, KLTN [$K_3Li_{2-2x}(Ta_yNb_{1-y})_{5+x}O_{15+x}$], $Ba_{1-x}Sr_xNb_2O_6$, etc., Mn—Zn ferrite, $LiNbO_3$, YAG substituted by Nd, Er or Yb, $YVO_4$ substituted by Nd, Er or Yb. Both the documents do not give any mention about the production of single crystals of fluorides.

The present invention aims to provide an apparatus enabling one to produce high quality crystals of fluorides in a very short period of time, method for producing such crystals, and a crucible suitably used for the apparatus.

DISCLOSURE OF INVENTION

The apparatus of the invention for producing fluoride crystals comprises a crucible having a perforation at its bottom, and produces a single crystal of fluoride by pulling down a single crystal mass from the crucible storing a melt of a fluoride material through the perforation of the crucible, the perforation having a length of 0 to 3 mm.

The length of the perforation is preferably 0 to 2 mm, more preferably 0 to 1 mm.

The crucible is made of carbon, platinum or iridium. Although carbon, platinum and iridium do not exhibit a high wettability to fluoride melt, the inventive crucible made of the above element can satisfactorily supply a melt of fluoride to a seed crystal. The features of the present invention are more manifest with the crucible made of the above element.

The method of the invention can be applied to any fluorides. When a fluoride chosen from calcium fluoride, barium fluoride and magnesium fluoride must be crystallized, it is difficult by a conventional method to avoid adverse effects inflicted by impurities and to control the crystallization process. Thus, in the crystallization of the above fluorides, the features of the invention become more manifest.

The diameter of the perforation is in the range of 0.1 to 5 mm. If the diameter in question is below 0.1 mm, it will be hardly possible to withdraw a single crystal through the perforation. If the diameter exceeds 5 mm, a melt of fluoride will sink through the perforation.

The crucible of the invention has, at its bottom, a perforation having a length of 0 to 3 mm.

The length of the perforation is preferably 0 to 2 mm.

The inventive crucible is a crucible for producing single crystals based on the pulling-down method.

The inventive crucible is a crucible for producing single crystals of fluorides.

The inventive crucible is made of carbon, platinum or iridium.

The inventive method for producing single crystals of fluorides comprises producing single crystals using an apparatus.

The pulling-down speed is preferably kept in the range of 0.03 to 5 mm/min. Putting the speed below 0.03 mm/min does not form a particular problem. However, if the speed exceeds 5 mm/min, the single crystal will be separated from the melt, and solid-liquid interface will not be formed.

Pulling-down of a single crystal is preferably performed at a temperature higher by 0 to 100° C. than the melting point of the fluoride. If the temperature is higher by a degree exceeding the above range than the melting point of the fluoride, the single crystal will be contaminated by impurities. Furthermore, since the temperature difference between solid phase and liquid phase is increased, crystal defects (such as dislocation) will arise as a result of thermal distortion.

(Operation)

The operation of the inventive apparatus and method will be described below with reference to the experience and findings leading to the invention.

The present inventors tried to grow a crystal of fluoride by the micro-pulling-down method, which was reported to allow the growth of crystal to occur at a speed higher by the order of 1 to 2 than the conventional crystal-growth-in-melt method. More specifically, the present inventors tried to apply the micro-pulling-down method as described in Patent Document 2 to produce a crystal of fluoride as described in Patent Document 1.

However, the crystal actually obtained by the above method was somewhat unsatisfactory in its crystallization. Namely, the quality of the obtained crystal was not necessarily satisfactory. The shortcomings were more apparent when a crucible made of carbon or platinum was used.

The present inventors ardently sought for the cause responsible for the shortcomings, and came upon to a hypothesis that the cause might lie in the insufficient contact between the melt kept in the crucible and the seed crystal or growing crystal. They further hypothesized that the cause might also lie in the insufficient supply of melt to the seed crystal because the seed crystal is moved faster with the pulling-down method than with the pull-up method. The present inventors got an insight that the fundamental cause for the shortcomings lies in the insufficient wettability of the crucible to the melt, particularly when the melt is derived from a fluoride.

Factors involved in the wettability of a substance are numerous. For example, the temperature of a melt is increased, the viscosity of the melt is reduced, and thus the wettability of the melt is increased. However, if the temperature of a melt is increased carelessly, the seed crystal will dissolve into the melt thereby disrupting the formation of solid-liquid interface, or the melt will be so ready to vaporize as to interfere with the intended growth of crystal. Reducing the pulling-down speed may seem to be a possible remedy for the problem, because it will ensure the more secure contact between the melt and the seed crystal. However, this measure will sacrifice one of the most important advantages of the micro-pulling-down method, i.e., high speed crystallization.

The present inventors studied those factors involved in the problem one by one, and, as a result of the study, got an idea that it might be possible to solve the problem by adjusting the length of the perforation formed on the bottom of a crucible.

The present inventors checked the construction of conventional crucibles, and found that scarcely any attention had been paid to the length of the perforation formed on the bottom of the crucibles.

The present inventors constructed crucibles having a perforation of 0 to 3 mm in length, and tried to grow crystals by using them. They found that the crucible allows the production of a single crystal excellent in crystallization, even when it is made of carbon, platinum or iridium, and the pulling-down speed is kept at a standard level, because then the contact of the seed crystal with the melt sinking through the perforation is improved. This finding led to the invention.

According to the invention, the length of the perforation is in the range of 0 to 3 mm. By using a crucible having such a perforation as described above, it is possible to produce impurity-free single crystals of fluoride excellent in crystallization at a high speed. Preferably, the length of the perforation is 2 mm or less, because then the above advantage will be more enhanced.

In conclusion, since the method of the invention allows the growth of crystal to occur at a speed higher by the order of 1 to 2 than a conventional crystal-growth-in-melt method, it ensures the shortening of the time necessary for crystal growth, and the production of high quality single crystals having a significantly large size from a limited amount of start material.

REFERENCE NUMERALS

Figure 1:
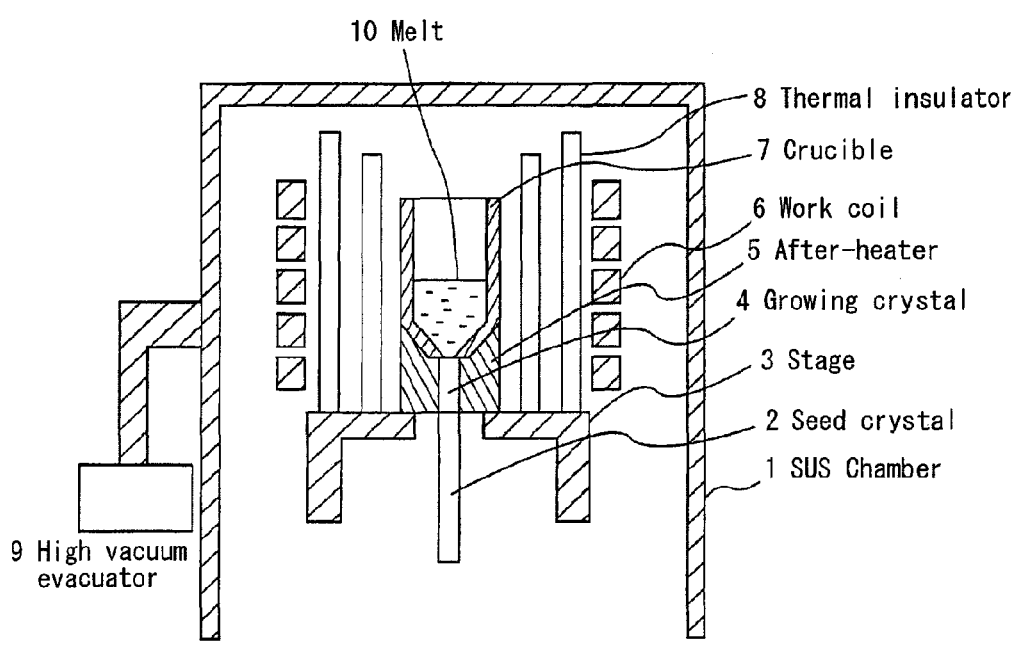
FIG. 1 is a schematic diagram of an atmosphere-controlled radio wave heating micro-pulling-down apparatus.

1. Chamber
2. Seed crystal
3. Stage
4. Growing crystal
5. After-heater
6. Work coil
7. Crucible
8. Thermal insulator
9. High vacuum evacuator
10. Melt
13. Perforation

BEST MODE FOR CARRYING OUT THE INVENTION

Figure 2:
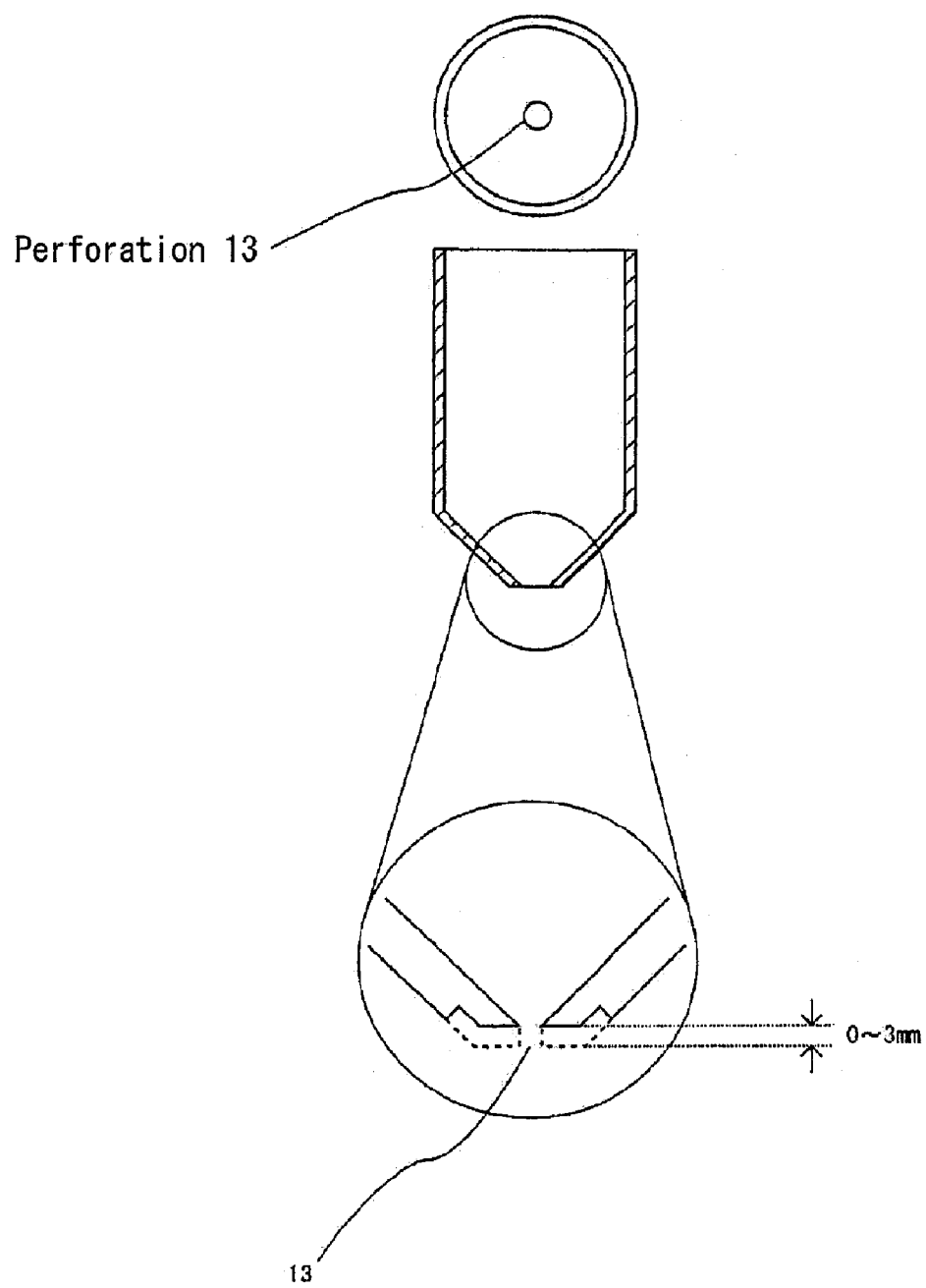
FIG. 2 is a schematic diagram of a crucible, which has, at its bottom, a perforation whose longitudinal length is adjusted to be 0 to 3 mm.

FIGS. 1 and 2 show an apparatus for producing crystals of fluoride representing an invention of the invention.

This apparatus for producing crystals of fluoride comprises a crucible 7 having a perforation 13 at its bottom, and produces a single crystal of fluoride by withdrawing a single crystal mass 4 from the crucible 7 storing a melt 10 of a fluoride material through the perforation 13 of the crucible 7, the perforation having a length of 0 to 3 mm.

The operation of the apparatus will be detailed below.

This is an apparatus obtained by modifying a conventional apparatus used for practicing the micro-pulling-down method to be adapted for the production of fluoride crystals.

This apparatus has a chamber 1. The chamber 1 is made of stainless steel (SUS 316).

An evacuator 9 is connected to chamber 1. In the particular example illustrated, in order to achieve high degree evacuation which is the most important for the successful growth of fluoride crystals, the evacuator 9 comprises, for example, a rotary pump with a diffusion pump affiliated (not illustrated). By virtue of this evacuation unit, it is possible to maintain the evacuation of chamber 1 at $1.3 \times 10^{-3}$ Pa or lower. Further, a gas inlet (not illustrated) is provided to chamber 1 so that gas such as Ar can be introduced into chamber 1. Gas, when used, preferably contains impurities at 10 ppb or lower.

A window is provided to chamber 1 so that the operator can observe the interior of the chamber. During operation, the operator can observe via an image on a CCD applied to the window the solid-liquid interface between a seed crystal 2 and a melt sinking through the perforation. The window may be made of $CaF_2$.

A stage 3 is provided in chamber 1. A crucible 7 and an after-heater 5 are placed on stage 3.

Around the wall of crucible 7, two layers of thermal insulators 8 are provided. The crucible 7 is then covered with a work coil 6. The work coil is provided for melting a fluoride material placed in crucible 10.

A perforation is provided at the bottom of crucible 7, and a seed crystal is placed opposite to the perforation. The seed crystal 2 is pulled down by means of a pulling-down rod. Crystal grows around the seed crystal, and around the periphery of the growing crystal the aftercare heater 5 is provided to prevent the crystal against from being cooled suddenly which would cause thermal distortion.

The crucible 7 is so constructed as to let the perforation 13 formed at its bottom have a length of 0 to 3 mm as shown in FIG. 2. The lowest end of crucible may have a profile like that of a cone to facilitate the sinking of melt. The summit of the cone is then perforated to form a passage. Since the crucible must have certain strength, its bottom has a certain thickness. However, even if the thickness of the bottom is 3 mm or more, it is possible to prepare a perforation having a length of 0 to 3 mm at the bottom of such a crucible, by cutting the summit of the cone at an appropriate level (by cutting the summit along a horizontal plane for the crucible depicted in the figure).

EXAMPLE

Example 1

An apparatus as shown in FIG. 1 was used to produce a crystal of calcium fluoride.

A crucible 7 made of highly pure carbon having a perforation (diameter, 1 mm; longitudinal length, 0 mm) at its bottom was prepared. The length of the perforation was chosen to facilitate the contact of a seed crystal with melt. A powder of calcium fluoride was transferred to the crucible 7, and a seed crystal 2, stage 3, after-heater 5 and thermal insulator 8 were set as shown in FIG. 1, and an oil-circulation pump and an oil-diffusion pump were driven to evacuate air, thereby producing a high degree vacuum there.

After confirming that the degree of vacuum is $1.3 \times 10^{-3}$ Pa or lower, Ar gas was allowed to flow into chamber 1, in effect, air in the chamber was substituted for Ar. Then, the chamber was heated by means of a radio-wave coil 6 to melt the powder of calcium fluoride. The melted calcium fluoride was maintained at 1450° C.

The bottom of crucible 7 was monitored with a CCD camera, and after confirming that the melt emerging from the perforation formed at the bottom of crucible 7 came into contact with the seed crystal, the seed crystal was pulled down while keeping the melt in contact with the seed to crystallize.

The solid-liquid interface was monitored with the CCD camera, and the pulling-down speed was adjusted such that a final speed of 0.5 mm/min was attained. In the end, a colorless, clear crystal of $CaF_2$ in the form of a cylinder with a diameter of 1 mm and length of 100 mm was obtained.

Example 2

In this example, the length of the perforation was varied between 0 and 5 mm.

When the length of the perforation was 5 or 4 mm, the melt 10 was not supplied to the seed crystal 2 and thus crystal failed to grow.

When the length of the perforation was 3.5 mm, the melt 10 came into contact with the seed crystal 2. However, the contact was not maintained constantly, and thus a single crystal excellent in crystallization was not obtained.

When the length of the perforation was 3, 2 or 1 mm, the melt 10 came into contact with the seed crystal 2. Of the single crystals obtained, their lattice deformations were evaluated. Single crystals obtained from crucibles whose perforation had a length of 2 mm or less hardly exhibited lattice deformations. Single crystals obtained from crucibles whose perforation had a length of 3 mm exhibited a few lattice deformations.

Industrial Applicability

According to the present invention, it becomes possible to obtain a high quality single crystal of fluoride at a high speed.

The invention claimed is:

1. A method for producing single crystals of fluorides, comprising steps of:
   providing an apparatus for producing a fluoride crystal, said apparatus comprising:
   a crucible; and
   a perforation disposed at a bottom of the crucible;
   wherein said apparatus is constructed and arranged to produce a single crystal of fluoride by pulling down a single crystal from the crucible storing a melt of a fluoride material through the perforation of the crucible, the perforation having a length of 0 to 3 mm;
   providing a melt of a fluoride material in the crucible; and
   pulling down a single crystal from the crucible to produce a single crystal of a fluoride.

2. The method according to claim 1, wherein the pulling-down speed of the single crystal is 0.03 to 5 mm/min.

3. The method according to claim 1, wherein the pulling-down is performed while the temperature of the melt is kept higher by 0 to 100° C. than the melting point of the fluoride material to be crystallized.

4. The method according to claim 2, wherein the pulling-down is performed while the temperature of the melt is kept higher by 0 to 100° C. than the melting point of the fluoride material to be crystallized.

5. The method according to claim 1, wherein the perforation has a length of 0 to 1 mm.

6. The method according to claim 1, wherein the fluoride material comprises calcium fluoride, barium fluoride or magnesium fluoride.

7. The method according to claim 1, wherein the crucible is made of carbon, platinum or iridium.

8. The method according to claim 1, wherein the melt of a fluoride material is maintained in the crucible under an inert gas.

* * * * *